(12) United States Patent
Wehbeh et al.

(10) Patent No.: US 10,769,330 B1
(45) Date of Patent: Sep. 8, 2020

(54) PARTITIONING A LARGE CIRCUIT MODEL FOR SIGNAL ELECTROMIGRATION ANALYSIS

(71) Applicant: Cadence Design Systems, Inc., San Jose, CA (US)

(72) Inventors: Jalal Wehbeh, Sunnyvale, CA (US); Harsh Vardhan, Fremont, CA (US); Federico Politi, Menlo Park, CA (US); Ajish Thomas, San Jose, CA (US); Aswin Ramakrishnan, El Cerrito, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 390 days.

(21) Appl. No.: 15/470,639

(22) Filed: Mar. 27, 2017

(51) Int. Cl.
  *G06F 30/33* (2020.01)
  *G06F 30/367* (2020.01)
  *G06F 30/398* (2020.01)
  *G06F 30/39* (2020.01)

(52) U.S. Cl.
  CPC ............ *G06F 30/33* (2020.01); *G06F 30/367* (2020.01); *G06F 30/39* (2020.01); *G06F 30/398* (2020.01)

(58) Field of Classification Search
  CPC ............ G06F 17/5009; G06F 17/5022; G06F 17/5068; G06F 17/5081; G06F 30/33; G06F 30/367; G06F 30/39; G06F 30/398
  See application file for complete search history.

(56) References Cited

U.S. PATENT DOCUMENTS

| | | | | |
|---|---|---|---|---|
| 5,841,674 A | * | 11/1998 | Johannsen | G06F 7/5318 716/104 |
| 6,557,145 B2 | * | 4/2003 | Boyle | G06F 17/505 716/105 |
| 6,880,139 B2 | * | 4/2005 | Mau | G06F 17/5036 716/115 |
| 7,562,325 B1 | * | 7/2009 | Arbel | G06F 17/505 716/125 |

(Continued)

OTHER PUBLICATIONS

Teng, C., et al. "Hierarchical Electromigration Reliability Diagnosis for VLSI Interconnects" IEEE 33rd Design Automation Conf., pp. 752-757 (1996) (Year: 1996).*

(Continued)

*Primary Examiner* — Jay Hann
(74) *Attorney, Agent, or Firm* — Vista IP Law Group, LLP

(57) ABSTRACT

A method for determining signal electromigration in a circuit includes selecting partitions from a netlist of the circuit is provided, each of the partitions including independent signal paths. The method includes determining a size of a partition, applying input vectors to a signal path in a large partition to obtain a signal toggle in an output, determining a current in the signal path, and identifying an electromigration result from the current flow. The method includes generating an output database for the partition, comprising an electromigration result for the first component, and combining the output database for the partition with a second output database from a second partition, the second output database including a second electromigration result for a second component in the second partition to generate an electromigration report for the netlist of the integrated circuit.

20 Claims, 6 Drawing Sheets

(56) References Cited

U.S. PATENT DOCUMENTS

| | | | |
|---|---|---|---|
| 7,971,171 B2* | 6/2011 | Keinert | G06F 17/5036 |
| | | | 716/112 |
| 8,713,498 B2* | 4/2014 | Shroff | G06F 17/5081 |
| | | | 716/110 |
| 9,043,771 B1* | 5/2015 | Vardhan | G06F 8/4435 |
| | | | 717/151 |
| 9,135,269 B2 | 9/2015 | Shetty et al. | |
| 9,323,870 B2* | 4/2016 | Chandra | G06F 17/5045 |
| 2013/0060657 A1 | 3/2013 | Kudva et al. | |
| 2015/0143317 A1* | 5/2015 | Gibson | G06F 17/5036 |
| | | | 716/115 |
| 2017/0147738 A1* | 5/2017 | Saraswat | G06F 17/5045 |

OTHER PUBLICATIONS

Najm, F., et al. "Probabilistic Simulation for Reliability Analysis of CMOS VLSI Circuits" IEEE Transactions on Computer Aided Design, vol. 9, No. 4 (1990) (Year: 1990).*

\* cited by examiner

PARTITIONING A LARGE CIRCUIT MODEL FOR SIGNAL ELECTROMIGRATION ANALYSIS

TECHNICAL FIELD

Embodiments described herein are generally related to the field of circuit simulation in circuit modeling and fabrication. More specifically, embodiments described herein are related to partitioning a large circuit model for efficient circuit simulation of electromigration effects.

BACKGROUND

Signal electromigration (SEM) is a phenomenon that causes wires and other circuit elements to deteriorate with usage as current flows through them. Current circuit models include large numbers of components arranged in ever-smaller dimensions, requiring small wires and resistors to withstand large current densities, thereby enhancing the deleterious effects of SEM. Given the possible large sizes of simulations and simulation tasks for complex circuits including billions of components in a single chip, integrated circuit models simplify the assumptions of signal flow in a circuit, thereby generally overestimating SEM effects. This results in modeling decisions such as reducing component density and the like, which ultimately reduce the cost efficiency of circuit fabrication. Furthermore, oversimplification may result in overlooking certain signal combinations that may occur during circuit operation, which may result in catastrophic circuit failure, forcing a complete re-design of a circuit. Such an outcome is highly undesirable, if only because of the large cost of retooling manufacturing protocols at the foundry level as well as the missed market window opportunity cost.

The description provided in the background section should not be assumed to be prior art merely because it is mentioned in or associated with the background section. The background section may include information that describes one or more aspects of the subject technology.

SUMMARY

In a first embodiment, a computer-implemented method for determining signal electromigration in an integrated circuit includes selecting a plurality of partitions from a netlist of the integrated circuit, each of the plurality of partitions including independent signal paths along a plurality of components. The method may also include determining a size of a selected partition from the plurality of partitions, when the size of the selected partition is greater than a pre-selected threshold applying input vectors to at least one signal path in the selected partition to obtain a signal toggle in an output of the selected partition, determining a current flow in the at least one signal path, and identifying an electromigration result from the current flow for a first component from the plurality of components. The method may further include generating an output database for the selected partition, the output database comprising an electromigration result for the first component and combining the output database for the selected partition with a second output database from a second partition, the second output database including a second electromigration result for a second component in the second partition to generate an electromigration report for the netlist of the integrated circuit.

In a second embodiment, a system includes a memory storing instructions and at least one processor that executes the instructions to perform steps to select a plurality of partitions from a netlist of the integrated circuit, each of the plurality of partitions including independent signal paths along a plurality of components. The processor further executes the instructions to determine a size of a selected partition from the plurality of partitions, when the size of the selected partition is greater than a pre-selected threshold the processor executes instructions to apply input vectors to at least one signal path in the selected partition to obtain a signal toggle in an output of the selected partition, and to determine a current flow in the at least one signal path. The processor further executes the instructions to identify an electromigration result from the current flow for a first component from the plurality of components, generate an output database for the selected partition, the output database including an electromigration result for the first component, and combine the output database for the selected partition with a second output database from a second partition, the second output database including a second electromigration result for a second component in the second partition to generate an electromigration report for the netlist of the integrated circuit.

In yet another embodiment, a non-transitory, machine-readable storage medium is described that includes machine-readable instructions for causing a processor to execute a method, including selecting a plurality of partitions from a netlist of the integrated circuit, each of the plurality of partitions including independent signal paths along a plurality of components. The method may also include determining a size of a selected partition from the plurality of partitions, when the size of the selected partition is greater than a pre-selected threshold, applying input vectors to at least one signal path in the selected partition to obtain a signal toggle in an output of the selected partition, determining a current flow in the at least one signal path, and identifying an electromigration result from the current flow for a first component from the plurality of components. The method may further include generating an output database for the selected partition, the output database comprising an electromigration result for the first component and combining the output database for the selected partition with a second output database from a second partition, the second output database including a second electromigration result for a second component in the second partition to generate an electromigration report for the netlist of the integrated circuit.

In a further embodiment, a system includes a means for storing instructions and a means to execute the instructions to perform steps to select a plurality of partitions from a netlist of the integrated circuit, each of the plurality of partitions including independent signal paths along a plurality of components. The means to execute the instructions is further configured to determine a size of a selected partition from the plurality of partitions, when the size of the selected partition is greater than a pre-selected threshold, apply input vectors to at least one signal path in the selected partition to obtain a signal toggle in an output of the selected partition, and determine a current flow in the at least one signal path. The means to execute the instructions is further configured to identify an electromigration result from the current flow for a first component from the plurality of components, generate an output database for the selected partition, the output database including an electromigration result for the first component, and to combine the output database for the selected partition with a second output database from a second partition, the second output database including a second electromigration result for a second component in the second partition to generate an electromigration report for the netlist of the integrated circuit.

BRIEF DESCRIPTION OF THE DRAWINGS

The accompanying drawings, which are included to provide further understanding and are incorporated in and constitute a part of this specification, illustrate disclosed embodiments and together with the description serve to explain the principles of the disclosed embodiments. In the drawings.

Figure 1:
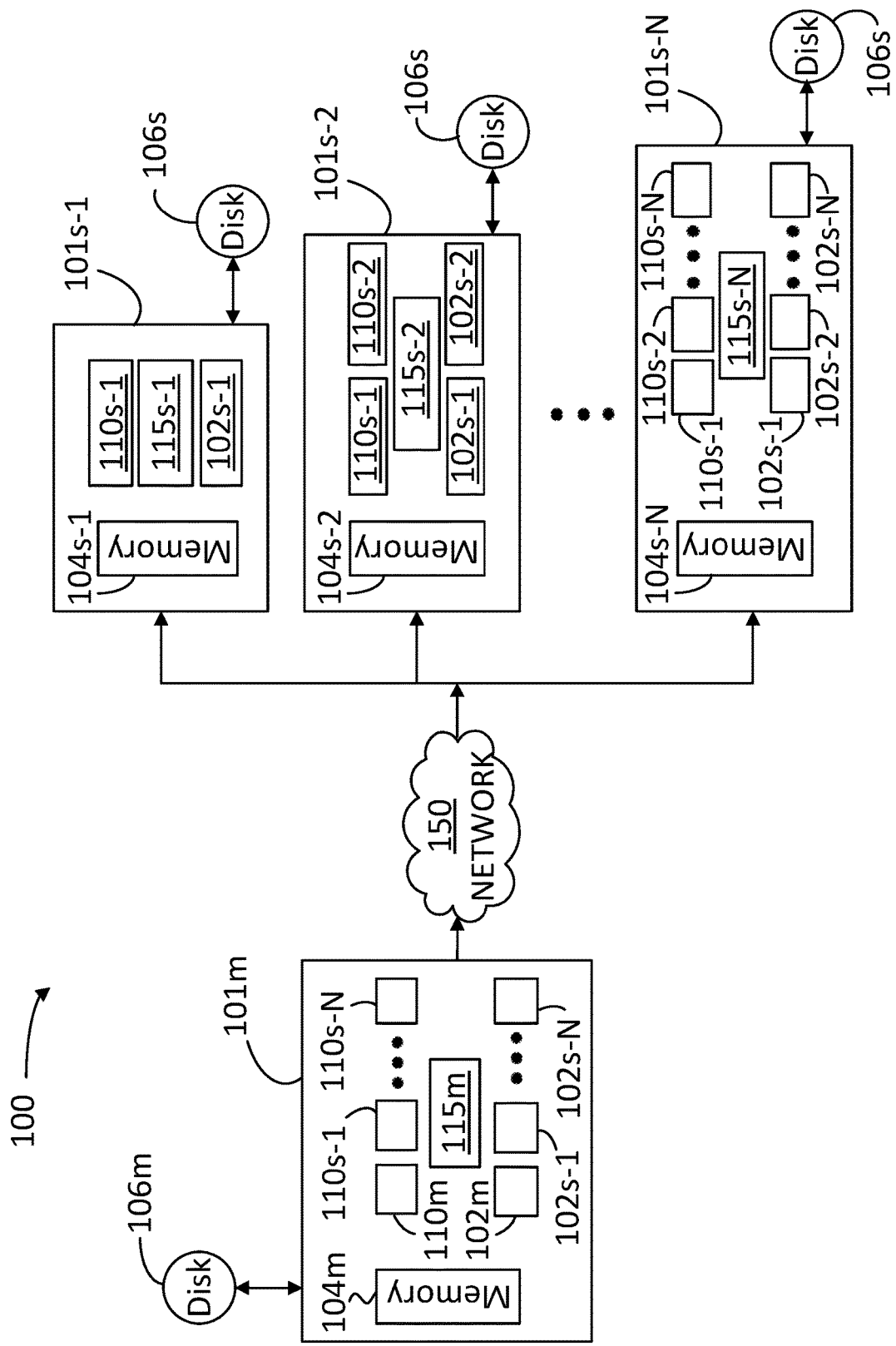
FIG. 1 is a block diagram of a cloud environment for IC modeling and characterization, according to some embodiments.

In the figures, elements and steps denoted by the same or similar reference numerals are associated with the same or similar elements and steps, unless indicated otherwise. In one or more implementations, not all of the depicted components in each figure may be required, and one or more implementations may include additional components not shown in a figure. Variations in the arrangement and type of the components may be made without departing from the scope of the subject disclosure. Additional components, different components, or fewer components may be utilized within the scope of the subject disclosure.

DETAILED DESCRIPTION

The detailed description set forth below is intended as a description of various implementations and is not intended to represent the only implementations in which the subject technology may be practiced. As those skilled in the art would realize, the described implementations may be modified in various different ways, all without departing from the scope of the present disclosure. Accordingly, the drawings and description are to be regarded as illustrative in nature and not restrictive.

General Overview

The disclosed system provides a method for partitioning a large circuit model for SEM analysis to provide a computationally efficient and electrically accurate circuit simulation of SEM effects.

The disclosed system addresses a technical problem tied to computer technology and arising in the realm of computer networks, namely the technical problem of efficient usage of multiple computer processing resources in a cloud environment for the purpose of obtaining a detailed integrated circuit model. The disclosed system solves this problem by partitioning a large circuit model into multiple, smaller circuit partitions that can be modeled efficiently using limited computational resources distributed in a network. For example, in some embodiments the limited computational resources include multiple servers forming the nodes of a network in a cloud environment. The system then re-groups the multiple resulting files from each circuit partition into a simulation file representing SEM effects for the entire circuit. Such an approach reduces the computational burden for each single server in a network node, increases the simulation speed of the large circuit model (e.g., in terms of CPU hour usage), and enables a more refined analysis of the large circuit model. A more refined analysis of an integrated circuit model may enable the identification of "critical paths" where performance is heavily dependent on the specific characteristic of circuit components along the critical path.

Embodiments of methods and systems as disclosed herein include static partitioning schemes having no inputs from the user. Some embodiments further include dynamic partitioning schemes including user inputs (e.g., input vectors, slew rate, frequency and the like). In embodiments as disclosed herein, an IC model is represented by an IC netlist including circuit components and the wires connecting them. The IC netlist may include a graphical layout of the circuit and associated files including specifications for each of the circuit components and wires. In a dynamic partitioning scheme, the IC netlist may be partitioned differently depending on the user inputs. Each of the resulting partitions may use inputs and outputs from other circuits and other partitions as well. Once the partitioning is accomplished, an electromagnetic simulation for each partition is performed in a parallel computation scheme, such as encountered in cloud environments. Accordingly, a plurality of servers (e.g., master and slave servers) coupled through a network is configured to generate, share where desirable, and apply stimulus vectors to create appropriate current flows and identify electromigration effects in each of the partitions.

Partitioning avoids the problem commonly found in simulation of large IC netlists of a "long pole" effect wherein it is difficult to address every possible output configuration by manipulating a discrete set of signal inputs in a long signal path. Accordingly, partitioning schemes as disclosed herein emphasize device functionality and connectivity rather than gate count. In fact, the parallelization of multiple computational threads according to the partitions alleviates the concern of handling massive numbers of gate counts in a time-efficient manner. Embodiments as disclosed herein include partitions that align with design hierarchy. Accordingly, in some embodiments a single partition may include slices of multiple circuit hierarchies without altering the hierarchy structure of the circuit. Native sandboxing and a time driven partitioning algorithm may be incorporated to robustly manage the long pole effect.

FIG. 1 is a block diagram of a cloud environment 100 for IC modeling and characterization, according to some embodiments. Cloud environment 100 may be a massive parallel architecture of computer servers including a master server 101m and a plurality of slave servers 101s-1 through 101s-N (hereinafter collectively referred to as "slave servers 101s") coupled through a network 150, where N is an integer number. Hereinafter, master server 101m and slave servers 101s in cloud environment 100 will be collectively referred to as "servers 101." Network 150 can include, for example, any one or more of a personal area network (PAN), a local area network (LAN), a campus area network (CAN), a metropolitan area network (MAN), a wide area network (WAN), a broadband network (BBN), the Internet, and the like. Further, the network 150 can include, but is not limited to, for example, any one or more of the following network topologies, including a bus network, a star network, a ring network, a mesh network, a star-bus network, tree or hierarchical network, or the like.

Each of servers 101 includes a memory and an operating system. For example, master server 101m includes memory 104m and operating system 115m, and slave servers 101s include memories 104s-1 through 104s-N (hereinafter collectively referred to as "memories 104"). Master server 101m may also include operating system 115m, and slave servers 101s may include slave operating systems 115s-1 through 115s-N (hereinafter, collectively referred to as "operating systems 115"). Master server 101m may also include application 110m, and slave servers 101s may include slave applications 110s-1 through 110s-N (hereinafter, collectively referred to as instances of "application 110"). Slave applications 110s-1 through N include copies of master application software 110m. Master server 101m may keep separate mirror images of slave applications 110s, associated with independent portions of master memory 104m. Memories 104, application software 110 and operating systems 115 are configured to store commands to be executed by processors 102m and 102s-1 through 102s-N (hereinafter collectively referred to as "processors 102") to perform at least partially methods as disclosed herein. Servers 101 may be coupled with external disks to save and retrieve data, such as disk 106m for master server 101m, and disks 106s for slave servers 101s (hereinafter, collectively referred to as "disks 106").

Master application 110m is the main instance of application 110 and may be initially executed by a user having access to master server 101m (e.g., through network 150). Master application 110m is configured to instantiate and control execution of slave applications 110s. For example, in some embodiments master application 110m provides suitable initialization routines to place each of slave applications 110s in a desired state to start a simulation run, and provides suitable tasks for each of slave applications 110s. The tasks may correspond to sequences or computational threads separately performed by each of slave applications 110s. Further, master application 110m is configured to collect the computation results from each of slave applications 110s, when available. Note that, in the architecture of cloud environment 100, master server 101m has created two instances of slave application 110s-1 and 110s-2 in slave server 101s-2, and up to N instances of slave applications 110s-1 through 110s-N in slave server 101s-N. The multiple instances of slave applications 110s in each of slave servers 101s may be executed independently of one another. For example, slave servers 101s-1 through 101s-N may be configured to perform a first computational thread in slave application 110s-1, slave servers 101s-2 through 102s-N may be configured to perform a second computational thread in slave application 110s-2, and so on. The results and data for each of the tasks in the first, second, and other computational threads are communicated to and from master server 101m, through network 150, to each of the corresponding slave servers 101s. Moreover, in some embodiments slave servers 101s may communicate with each other through network 150 to share data and results within commonly executed computational threads. For example, slave server 101s-1 may communicate with slave server 101s-2 data associated with the first computational thread, and so on.

Figure 2:
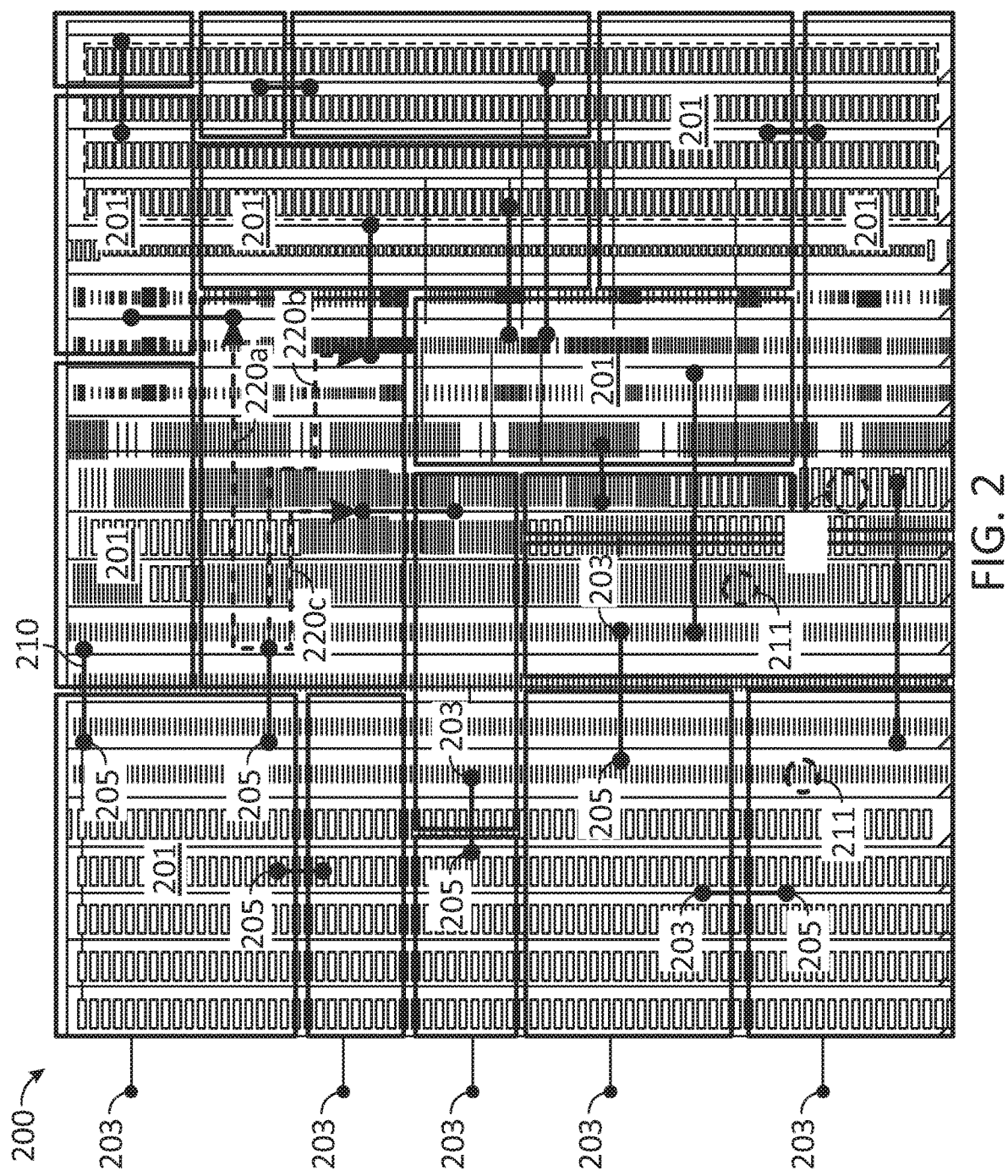
FIG. 2 illustrates partitions of an IC model for signal electromigration analysis, according to some embodiments.

FIG. 2 illustrates partitions 201 of an IC netlist 200 for signal electromigration analysis, according to some embodiments. IC netlist 200 represents an IC model including multiple components 211 that may include transistors, resistors, capacitors, inductors, and the wires coupling them. As a non-limiting example, components 211 may include metal-oxide-semiconductor (MOS) transistors such as N-type MOS (NMOS) transistors, P-type MOS (PMOS) transistors, field-effect (FET) transistors, fin FET (FinFET) transistors, and the like. Each partition 201 includes multiple components 211, at least one input 203 and at least one or more outputs 205. Input 203 may be coupled to an external signal, or to a signal provided by output 205 from another partition 201. In some embodiments, partitions 201 that are non-adjacent may also be coupled through wires 210 in an output/input configuration. In some embodiments, partitioning of IC netlist 200 is performed so that input/output coupling between different partitions 201 through wires 210 occurs across adjacent partitions 201. Accordingly, it is desirable that wires 210 coupling different partitions 201 be shortened to avoid undue time-lag, loss, capacitive effects and other undesirable effects that reduce signal performance. By reducing deleterious effects in signal performance, overall current intensity through wires 210 is desirably kept at lower values, thus reducing the intensity of SEM effects in the IC model.

Each partition 201 further includes at least one signal path 220a, or 220b (hereinafter, collectively referred to as signal paths 220) joining an input 203 to an output 205. Signal paths 220 couple multiple circuit elements sequentially in time and may be logically independent from one another. In some embodiments, signal paths 220 may have a degree of logical coupling, forming a tree wherein a trunk may branch out into multiple signal paths within partition 201. In some embodiments, multiple signal paths may converge into a single path leading into an output 205. Convergence of multiple signal paths 220, or branching out of multiple signal paths 220 are features that may have an impact in SEM of the wires and other elements along signal paths 220. For example, configurations in which all converging signals in a tree include a "high" state (1') tend to increase the current level in the converging signal path, thereby enhancing SEM effects at least for a period of time. In some embodiments, one of the signal paths (e.g., signal path 220b) may be designated as a "critical path," wherein the time it takes a signal to traverse partition 201 from input 203 to output 205 in path 220b is the longest for any of signal paths 220. A size of a partition 201 may be associated to the number of circuit elements (e.g., resistors, transistors, capacitors, inductors and the like) in the partition, the number of signal paths in the partition, the number of inputs 203 and outputs 205 in the partition, or the length (in time or in distance) of critical path 220b. Each signal path 220 may involve a separate simulation step.

Figure 3:
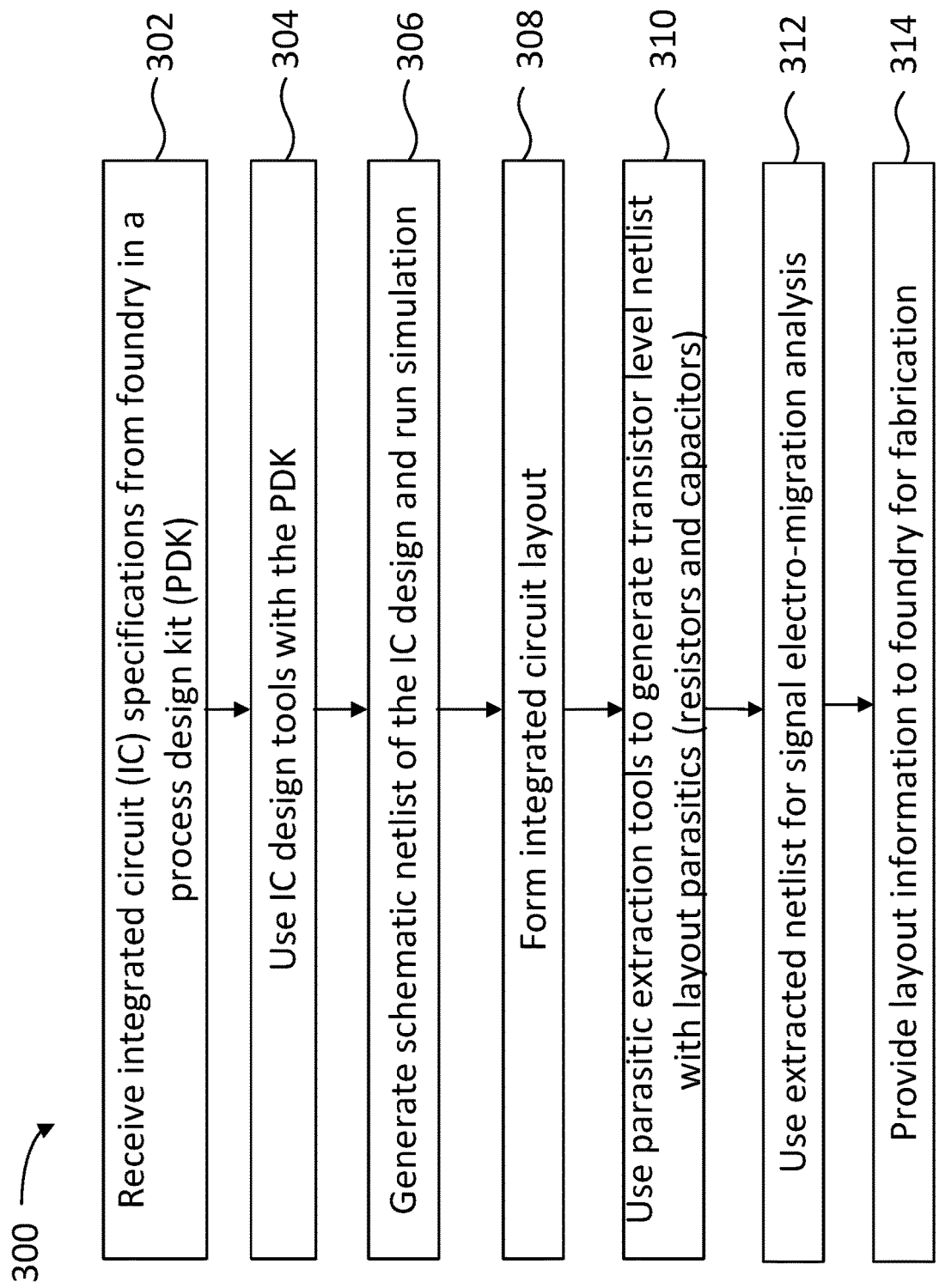
FIG. 3 is a flowchart including steps in a method for IC modeling and characterization according to some embodiments.

FIG. 3 illustrates a flowchart including steps in a method 300 for IC modeling and characterization according to some embodiments. At least some of the steps in method 300 may be performed by a computer having a processor executing commands stored in a memory of the computer. Further, steps as disclosed in method 300 may include retrieving, editing, and/or storing files in a database that is part of, or is communicably coupled to, the computer. Methods consistent with the present disclosure may include at least some, but not all of the steps illustrated in method 300, performed in a different sequence. Furthermore, methods consistent with the present disclosure may include at least two or more steps as in method 300, performed overlapping in time, or almost simultaneously.

In some embodiments, at least one or more of the steps in method 300 may be performed in cloud computing environment 100, wherein the computer may include servers 101, such as a master server 101*m* and a slave servers 101*s*. Accordingly, at least some of the steps illustrated in method 300 may be performed in parallel in different processors 102, following separate computational threads. For example, each of the separate computational threads may be performed by at least one of slave servers 102*s* in each of the applications 110*s* and processors 102*s* dedicated to the specific computational thread.

In some embodiments, master processor 101*m* is configured to provide slave processor 101*s* with an initialization routine to perform at least one of the steps in method 300, and to control an execution of at least one of the steps in method 300 by slave processor 102*s*. Furthermore, a first processor 102 may partially perform at least one of the steps of method 300 in a first computational thread and a second processor 102 may partially perform at least a second one of the steps of method 300 in a second computational thread.

Step 302 includes receiving IC specifications from a foundry. In some embodiments, step 302 may include retrieving a "process development kit" (PDK) file from the foundry, wherein device specifications are listed as functions of independent random variables that a designer may use to develop statistical analysis of the IC performance.

Step 304 includes using IC design tools together with the PDK to generate an IC model. In some embodiments, step 304 includes selecting a characterization tool for the IC modeling task. In some embodiments, step 304 may include selecting a tool from a platform for characterizing multiple IC blocks such as standard cells, memories, mixed signal blocks for timing, variation, signal integrity, power and electro-migration, among other features of IC design.

Step 306 includes generating a schematic netlist of the integrated circuit design and running a simulation of the schematic netlist. In some embodiments, step 306 includes generating an IC model as IC netlist 200.

Step 308 includes forming the integrated circuit layout.

Step 310 includes using parasitic extraction tools to generate a transistor level netlist with layout parasitics. In some embodiments, the layout parasitics may include effects from resistors and capacitors in the netlist simulation.

Step 312 includes using the extracted netlist for a signal electro-migration (SEM) analysis. In some embodiments, step 312 includes transferring the extracted netlist to a parallel architecture for SEM analysis. The parallel architecture may include master server 101*m* and slave servers 101*s* coupled through network 150. In some embodiments, step 312 includes separating IC netlist 200 into partitions 201, and separating multiple simulation tasks in computational threads across each of the different partitions 201. For example, a computational thread in cloud environment 100 may be associated with a specific partition 201. This procedure enables efficient and accurate dynamic simulation of partitions 201 (e.g., through simulation tools such as "SPICE" and the like). To separate multiple simulation tasks across each of the different partitions 201, step 312 may include preparing input data files for each of the tasks in the computational threads associated with each of partitions 201. In some embodiments, step 312 also includes combining multiple computational thread results from multiple partitions 201 into a single SEM database for the entire IC netlist 200. The single SEM database may include a single file, or a cluster of files associated with IC netlist 200, wherein a user may determine SEM characteristics of any portion of IC netlist 200. In some embodiments, step 312 may include providing an electromigration report for IC netlist 200 to the foundry. The electromigration report may include the electromigration performance of the plurality of components 211 in IC netlist 200, including expected lifetimes for components 211. The electromigration report may further include statistical analysis of the expected electromigration lifetimes of different components 211, according to multiple random fabrication variables provided by the foundry in the PDK file.

Step 314 includes providing the layout information to a foundry, to fabricate the integrated circuit. Based on the layout information, the foundry may decide to revise a device specification, such as modified operational conditions (e.g., environmental operation conditions, and the like). In some configurations, the foundry may decide to modify the IC model when certain performance specifications (e.g., SEM lifetime) fall out of an acceptable range.

Figure 4:
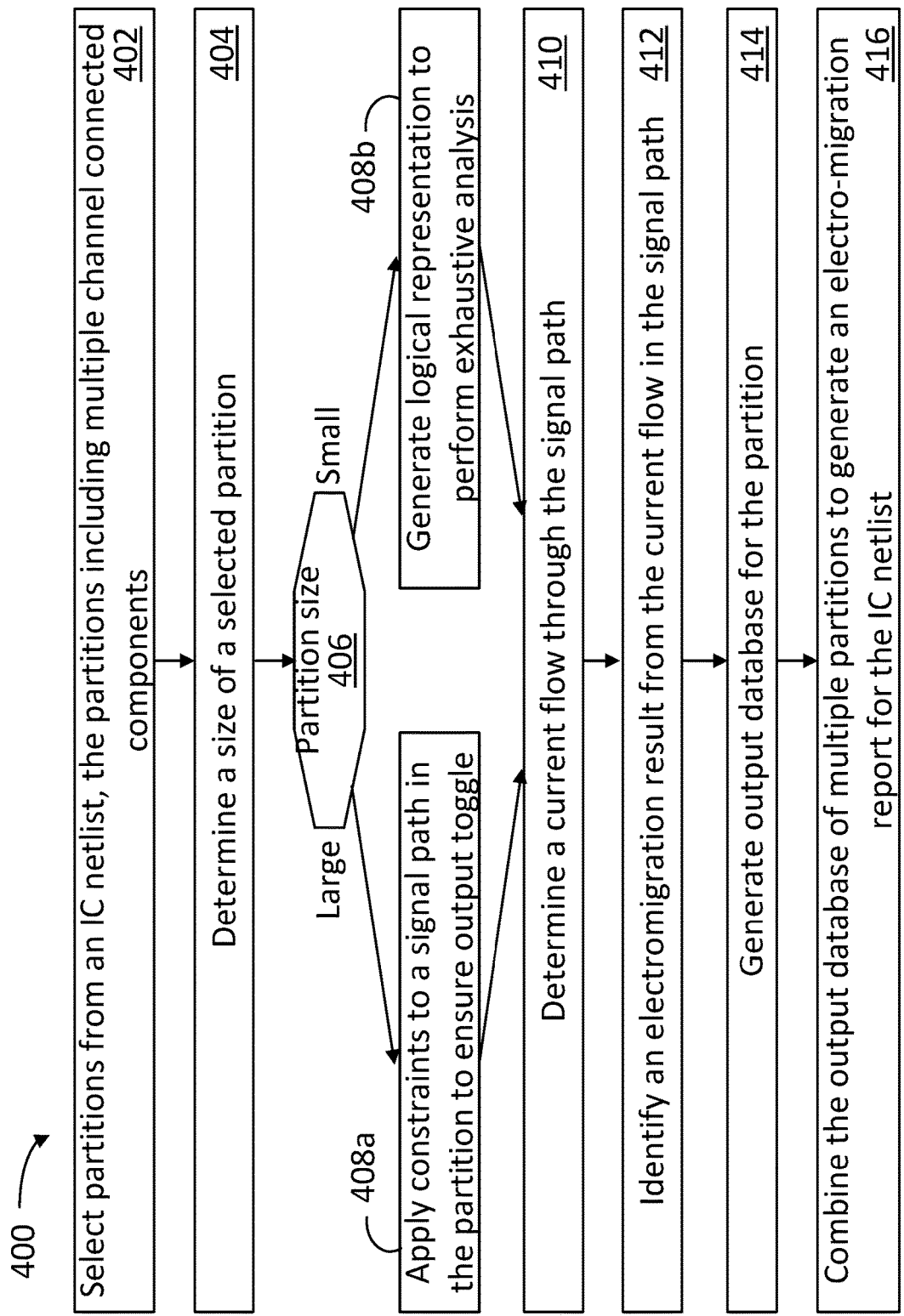
FIG. 4 is a flowchart including steps in a method for transferring a post layout extracted netlist model of an IC to a massive parallel architecture, according to some embodiments.

FIG. 4 illustrates a flowchart including steps in a method 400 for transferring IC netlist 200 to a massive parallel architecture, according to some embodiments. At least some of the steps in method 400 may be performed by a computer having a processor executing commands stored in a memory of the computer. Further, steps as disclosed in method 400 may include retrieving, editing, and/or storing files in a database that is part of, or is communicably coupled to, the computer. Methods consistent with the present disclosure may include at least some, but not all of the steps illustrated in method 400, performed in a different sequence. Furthermore, methods consistent with the present disclosure may include at least two or more steps as in method 400, performed overlapping in time, or almost simultaneously.

In some embodiments, at least one or more of the steps in method 400 may be performed in cloud computing environment 100, wherein the computer may include servers 101, such as a master server 101*m* and slave servers 101*s*. Accordingly, at least some of the steps illustrated in method 400 may be performed in parallel in different processors 102, following separate computational threads. For example, each of the separate computational threads may be performed by at least one of slave servers 102*s* in each of the applications 110*s* and processors 102*s* dedicated to the specific computational thread.

In some embodiments, master processor 101*m* is configured to provide slave processor 101*s* with an initialization routine to perform at least one of the steps in method 400, and to control an execution of at least one of the steps in method 400 by slave processor 102*s*. Furthermore, a first processor 102 may partially perform at least one of the steps of method 400 in a first computational thread and a second processor 102 may partially perform at least a second one of the steps of method 400 in a second computational thread.

Step 402 includes selecting partitions 201 from IC netlist 200, the partitions including multiple components 211. In some embodiments, step 402 may include generating IC netlist 200. In some embodiments, step 402 includes receiving IC netlist 200 including a static timing analysis of a large circuit design, carried out in an input independent manner. In some embodiments step 402 includes selecting partitions to create separate netlists. In some embodiments, step 402 includes selecting partitions 201 in IC netlist 200 have strongly connected components 211. For example, step 402 may include selecting partitions 201 with data paths that may overlap in multiple points, leading to branching nodes or converging nodes. Thus, each partition desirably reflects the performance of IC netlist 200 under a well-defined set of constraints (e.g., as reflected by a stimulus vector or input logic condition). In some embodiments, step 402 includes selecting at least one signal path in at least one partition 201 to be a critical path.

Step 404 includes determining a size of a selected partition 201. In some embodiments, step 404 includes determining the number components 211 in partition 201, or determining a length of at least one signal path in partition 201. The partition size may be associated with the number of independent signal paths in partition 201. In some embodiments, the partition size is associated with the length of the critical path 220b in the partition. A small partition may include as few as three or four independent signal paths. On the other hand, a large partition may include thousands of independent signal paths. In some embodiments, a small partition could be a simple logic gate such as a two-input NAND gate, using one, two, three, or a few transistors such as metal-oxide semiconductor field effect transistors (MOSFETs), Fin-gate field effect transistors (FinFETs), and the like. A large partition could be a portion of a memory block, repeated multiple times to construct an entire memory circuit, and including thousands or millions of MOSFETs, FinFETs, and the like.

Step 406 includes determining whether the partition size is large or small. When the partition size is larger than a pre-selected threshold, step 408a includes applying constraints to a signal path in partition 201 to ensure an output toggle. Accordingly, step 408a may include applying slews, loads and constraints to partition 201 to ensure a signal toggle in output 205. In some embodiments, step 406 includes selecting a threshold from a unified metric based on multiple automatic and user-controlled parameters such as number of inputs, outputs, number of devices, and the like. Accordingly, in some embodiments step 406 includes dynamically deciding a simulation granularity by adjusting the pre-selected threshold for handling large or small partitions based on the specific IC netlist and the modeling stage.

In some embodiments, step 408a includes receiving at least one integrated circuit specification from a foundry, wherein applying constraints to a signal path includes adjusting an input signal in the signal path according to at least one integrated circuit specification.

When the partition size is smaller than the pre-selected threshold, step 408b includes generating a logical representation to perform an exhaustive analysis of signal electromigration effects in partition 201. For example, step 408b may include using multiple input signals in partition 201. Accordingly, step 408b may include generating logical representations for each possible combination of logical input signals at inputs 203 for partition 201.

Step 410 includes determining a current flow through the signal path. In some embodiments, step 410 includes performing an electromagnetic simulation of a current flow in partition 201. Step 410 may include selecting one or more stimulus vectors to provide input signals for the electromagnetic simulation of the current flow.

Step 412 includes identifying an electromigration result from the current flow in the signal path. Accordingly, step 412 may include identifying whether each of the metal wires in partition 201 will be able to support the simulated current flow. In some embodiments, step 412 includes determining whether component 211 in partition 201 sustains the current flow. Further, step 412 may include determining a period of time for which component 211 is able to sustain the current flow. In some embodiments, step 412 further includes modifying one or more components 211 in partition 201 when it is determined that at least one of components 211 cannot sustain the current flow, or that the period of time for which component 211 is able to sustain the current flow is lower than a pre-selected threshold.

In some embodiments, step 412 includes identifying a second electromigration result of a current flow for a second component 211 in a second partition 201. In that regard, step 412 may include determining the second electromigration result in a second computational thread, separately from identifying the electromigration result of the current flow for the signal path in the first partition 201 (in a first computational thread). Accordingly, step 412 may include performing the first computational thread and the second computational thread in separate processors 102 of a server 101, or in two different servers 101 (e.g., including a master server 101m or any two slave servers 101s).

Step 414 includes generating an output database for each partition 201. The output database may include a file listing expected lifetimes or degradation rates for each of components 211 in partition 201. In some embodiments, step 414 includes providing an electromigration performance of components 211 in the selected partition 201 and an electromigration performance of a second group of components 211 in the second partition 201, to a foundry.

Step 416 includes generating an electromigration report for the entire IC netlist 200. In some embodiments, step 416 includes piecing together the output databases for each partition in the IC model. Accordingly, step 416 may include combining results of multiple computational threads and creating an SEM database for IC netlist 200 including all partitions 201. In some embodiments, step 416 includes providing the SEM database including the electromigration performance of components 211 in the selected partition and the electromigration performance of a second group of components 211 in the second partition, to the foundry.

In some embodiments, step 416 includes generating the output database for the selected partition using a first processor running a first computational thread, and generating a second output database in a second processor running a second computational thread. Further, in some embodiments step 416 includes running instructions from a first application 110 to generate the output database for the selected partition in a first computational thread, and running instructions from a second application 110 to generate the second output database in a second computational thread.

Figure 5:
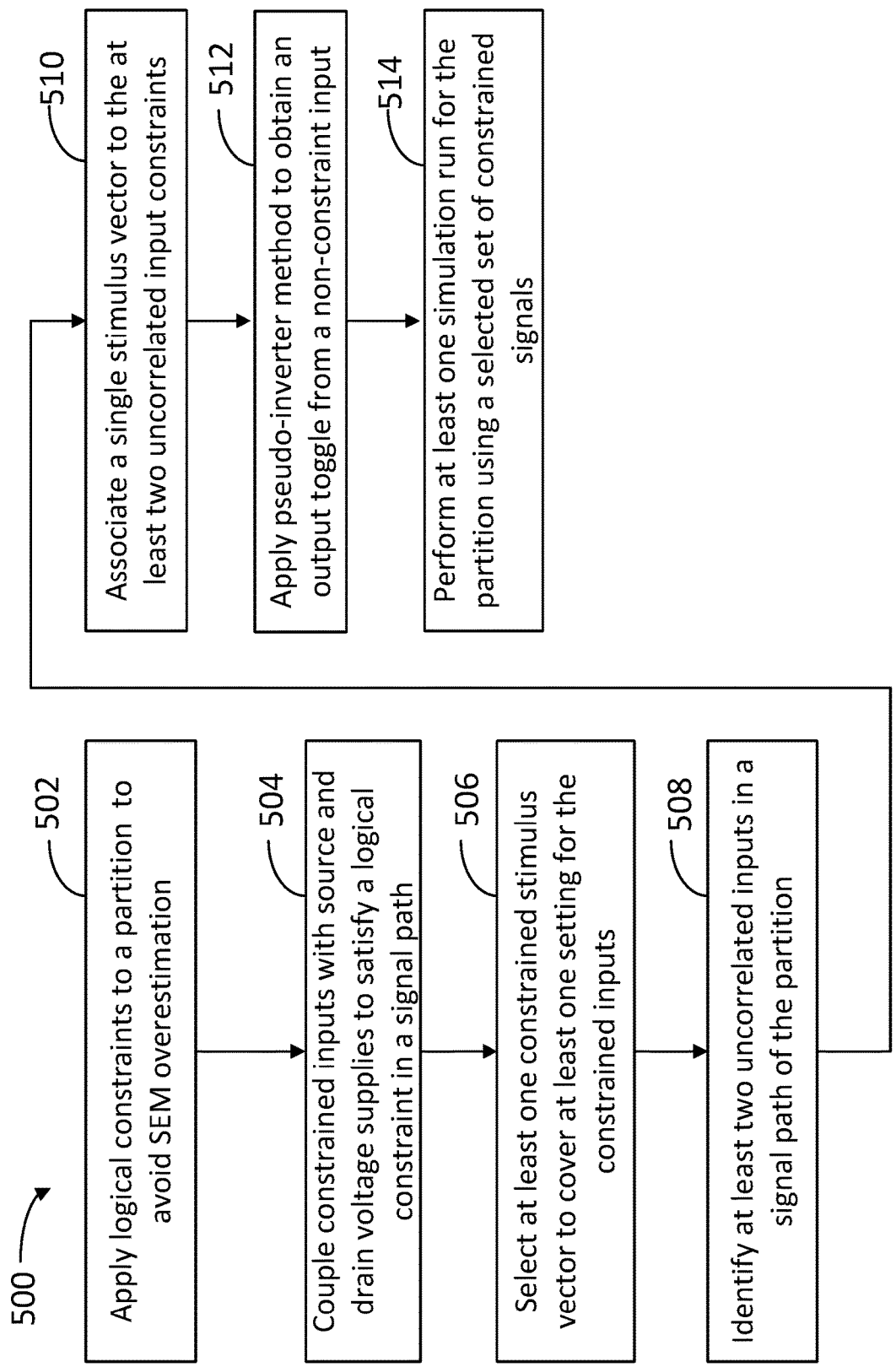
FIG. 5 is a flowchart including steps in a method for simulating a large partition channel connected circuit (CCC), according to some embodiments.

FIG. 5 illustrates a flowchart including steps in a method 500 for simulating a large partition CCC, according to some embodiments. At least some of the steps in method 500 may be performed by a computer having a processor executing commands stored in a memory of the computer. Further, steps as disclosed in method 500 may include retrieving, editing, and/or storing files in a database that is part of, or is communicably coupled to, the computer. Methods consistent with the present disclosure may include at least some, but not all of the steps illustrated in method 500, performed in a different sequence. Furthermore, methods consistent with the present disclosure may include at least two or more steps as in method 500 performed overlapping in time, or almost simultaneously.

In some embodiments, at least one or more of the steps in method 500 may be performed in cloud computing environment 100, wherein the computer may include servers 101, such as a master server 101m and slave servers 101s. Accordingly, at least some of the steps illustrated in method 500 may be performed in parallel in different processors 102, following separate computational threads. For example, each of the separate computational threads may be performed by at least one of slave servers 102s in each of the applications 110s and processors 102s dedicated to the specific computational thread.

In some embodiments, master processor 101m is configured to provide slave processors 101s with an initialization routine to perform at least one of the steps in method 500, and to control an execution of the at least one of the steps in method 500 by slave processors 102s. Furthermore, a first processor 102 may partially perform at least one of the steps of method 500 in a first computational thread and a second processor 102 may partially perform at least a second one of the steps of method 500 in a second computational thread.

Step 502 includes applying logical constraints to partition 201 to avoid an electromigration effect overestimation. In some embodiments, step 502 may include identifying a one (1)-hot group of signals or a complementary signals, to avoid SEM overestimation. A 1-hot group of signals is a set of mutually exclusive binary signals (e.g., only one may have a logic state of 1 while the other have a logic state of 0). Complementary signals are a pair of 1-hot signals that have values that are opposite to each other. For example, two complementary signals may attain values "1/0," or "0/1."

Step 504 includes coupling a constrained input in partition 201 with a voltage supply for a source terminal or a voltage supply for a drain terminal for a component 211 to satisfy a logical constraint in a signal path of the partition. For example, in some embodiments step 504 includes coupling a constrained input that is set to logical 1 to VDD power supply or a constraint input that is set to logical 0 to VSS or ground supply. Accordingly, an electromagnetic simulation of partition 201 is enabled to probe current flows along the channels of transistors and other components in IC netlist 200.

Step 506 includes selecting at least one stimulus vector to cover at least one of the input constraints. Further, in some embodiments, step 506 includes generating multiple stimulus vectors to cover all of the input constraints identified for partition 201. In this regard, step 506 may include selecting a set of stimulus vector that exhausts all, or almost all, of the constraint input configurations for partition 201.

Step 508 includes identifying uncorrelated input constraints in partition 201. In some embodiments, the uncorrelated input constraints in step 508 include at least one input constraint according to a component specification, or an IC specification imposed on the signal path. In some embodiments, step 508 includes verifying that two input constraints are uncorrelated.

Step 510 includes associating a single stimulus vector to at least two uncorrelated input constraints. Accordingly, embodiments as disclosed herein reduce the number of stimulus vectors that are used to determine an electromigration effect, thus enhancing computation efficiency. Step 512 described below include performing simulation runs on a netlist associated with partition 201. Accordingly, a simulation run, as disclosed herein, includes an electromagnetic simulation of the netlist performance. For example, the electromagnetic simulation propagates a signal provided to input 203, through components 211, to output 205. Accordingly, the signal provided to input 203 is at least a portion of one of the selected constrained stimulus vectors.

Step 512 includes applying a pseudo-inverter method to the non-constraint inputs of a partition obtain an output toggle. In some embodiments, step 512 includes modifying a netlist for partition 201 to form at least two data paths that are the logic opposite of each other from input 203 to output 205. For example, a first data path may provide a pull-up path that sets the output to logic 1 when the input is at logic 0, and a second data path may provide a pull-down path that sets the output to logic 0 when the input is at logic 1. Multiple pullup and pull down paths can be enabled to set the output to logical 1 or to logical 0. Such paths can share common sections of partition 201. In some embodiments, step 512 includes suitably connecting different inputs together and adding voltage sources and ground connections to components 211 in partition 201 to achieve a logical pseudo-inverter operation. In some embodiments, step 512 may include adding to the original input a second input that is the logical compliment of the first input, to provide pullup or pulldown paths for the output signal. In some embodiments, modifying the netlist for partition 201 in step 512 includes maintaining all components 211 in partition 201. In some embodiments, modifying the netlist for partition 201 in step 512 includes maintaining at least the transistors, resistors, and capacitors in partition 201.

Step 514 includes performing at least one simulation run for the partition using a selected setting of constrained inputs that avoids SEM overestimation and the pseudo-inverter inputs. In some embodiments, step 514 includes simulating multiple constraint input settings over multiple time windows in the same simulation run. In some embodiments, step 514, may include separating a simulation run for a first set of constraints in a first computational thread and a simulation run for a second set of constraints in a second computational thread. Further, the first and second computational threads may be performed in first and second processors of the same slave server 101s. Accordingly, some embodiments may include different strategies for running a constraint pseudo inverter CCC, which may be performed sequentially, simultaneously, overlapping in time, or in any desired order, without limitation.

Step 514 may further include performing at least two simulation runs using at least two time windows for the partition, to cover at least one constrained stimulus vector. In some embodiments, more simulation runs covering additional time windows may be desired, especially when multiple constrained stimulus vectors are available. In some embodiments, step 514 includes performing a simulation run for the at least two identified uncorrelated constraints using the associated stimulus vector. In some embodiments, step 514 may include separating a simulation run for a first constraint in a first computational thread and a simulation run for a second uncorrelated constraint in a second computational thread. Further, the first and second computational threads may be performed in first and second processors of the same slave server 101s-2 having access to the same stimulus vector.

Figure 6:
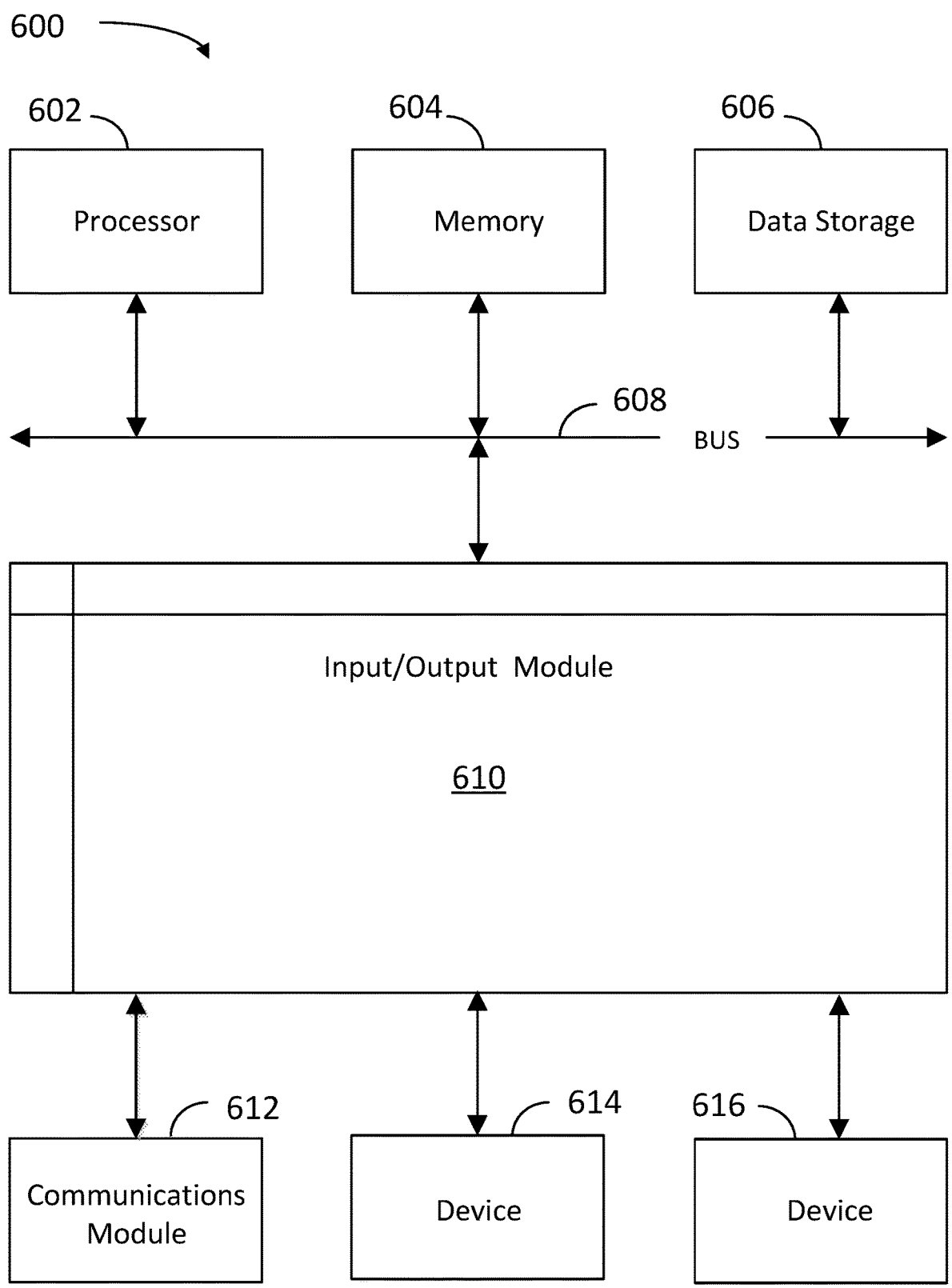
FIG. 6 is a block diagram illustrating an example computer system that includes a design tool, according to some embodiments.

FIG. 6 is a block diagram illustrating an example computer system 600 with which the methods and steps illustrated in FIGS. 3-5 can be implemented, according to some embodiments. In certain aspects, computer system 600 can be implemented using hardware or a combination of software and hardware, either in a dedicated server, integrated into another entity, or distributed across multiple entities.

Computer system 600 includes a bus 608 or other communication mechanism for communicating information, and a processor 602 coupled with bus 608 for processing information. By way of example, computer system 600 can be implemented with one or more processors 602. Processor 602 can be a general-purpose microprocessor, a microcontroller, a Digital Signal Processor (DSP), an Application Specific Integrated Circuit (ASIC), a Field Programmable Gate Array (FPGA), a Programmable Logic Device (PLD), a controller, a state machine, gated logic, discrete hardware components, or any other suitable entity that can perform calculations or other manipulations of information. In some embodiments, processor 602 may include modules and circuits configured as a 'placing' tool or engine, or a 'routing' tool or engine, to place devices and route channels in a circuit layout, respectively and as disclosed herein.

Computer system 600 includes, in addition to hardware, code that creates an execution environment for the computer program in question, e.g., code that constitutes processor firmware, a protocol stack, a database management system, an operating system, or a combination of one or more of them stored in an included memory 604, such as a Random Access Memory (RAM), a flash memory, a Read Only Memory (ROM), a Programmable Read-Only Memory (PROM), an Erasable PROM (EPROM), registers, a hard disk, a removable disk, a CD-ROM, a DVD, or any other suitable storage device, coupled to bus 608 for storing information and instructions to be executed by processor 602. Processor 602 and memory 604 can be supplemented by, or incorporated in, special purpose logic circuitry.

The instructions may be stored in memory 604 and implemented in one or more computer program products, i.e., one or more modules of computer program instructions encoded on a computer readable medium for execution by, or to control the operation of, the computer system 600, and according to any method well known to those of skill in the art, including, but not limited to, computer languages such as data-oriented languages (e.g., SQL, dBase), system languages (e.g., C, Objective-C, C++, Assembly), architectural languages (e.g., Java, .NET), and application languages (e.g., PHP, Ruby, Perl, Python). Instructions may also be implemented in computer languages such as array languages, aspect-oriented languages, assembly languages, authoring languages, command line interface languages, compiled languages, concurrent languages, curly-bracket languages, dataflow languages, data-structured languages, declarative languages, esoteric languages, extension languages, fourth-generation languages, functional languages, interactive mode languages, interpreted languages, iterative languages, list-based languages, little languages, logic-based languages, machine languages, macro languages, metaprogramming languages, multiparadigm languages, numerical analysis, non-English-based languages, object-oriented class-based languages, object-oriented prototype-based languages, off-side rule languages, procedural languages, reflective languages, rule-based languages, scripting languages, stack-based languages, synchronous languages, syntax handling languages, visual languages, Wirth languages, embeddable languages, and xml-based languages. Memory 604 may also be used for storing temporary variable or other intermediate information during execution of instructions to be executed by processor 602.

A computer program as discussed herein does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, subprograms, or portions of code). A computer program can be deployed to be executed on one computer or on multiple computers that are located at one site or distributed across multiple sites and interconnected by a communication network. The processes and logic flows described in this specification can be performed by one or more programmable processors executing one or more computer programs to perform functions by operating on input data and generating output.

Computer system 600 further includes a data storage device 606 such as a magnetic disk or optical disk, coupled to bus 608 for storing information and instructions. More generally, data storage device 606 may include any type of non-transitory, computer-readable medium configured to store data.

Computer system 600 is coupled via input/output module 610 to various devices. The input/output module 610 is any input/output module. Example input/output modules 610 include data ports such as USB ports. The input/output module 610 is configured to connect to a communications module 612. Example communications modules 612 include networking interface cards, such as Ethernet cards and modems. In certain aspects, the input/output module 610 is configured to connect to a plurality of devices, such as an input device 614 and/or an output device 616. Example input devices 614 include a keyboard and a pointing device, e.g., a mouse or a trackball, by which a user can provide input to the computer system 600. Other kinds of input devices 614 are used to provide for interaction with a user as well, such as a tactile input device, visual input device, audio input device, or brain-computer interface device. For example, feedback provided to the user can be any form of sensory feedback, e.g., visual feedback, auditory feedback, or tactile feedback; and input from the user can be received in any form, including acoustic, speech, tactile, or brain wave input. Example output devices 616 include display devices, such as a LED (light emitting diode), CRT (cathode ray tube), or LCD (liquid crystal display) screen, for displaying information to the user.

Methods as disclosed herein may be performed by computer system 600 in response to processor 602 executing one or more sequences of one or more instructions contained in memory 604. Such instructions may be read into memory 604 from another machine-readable medium, such as data storage device 606. Execution of the sequence of instructions contained in main memory 604 causes processor 602 to perform the process steps described herein (e.g., as in methods 300-500). One or more processors in a multi-processing arrangement may also be employed to execute the sequence of instructions contained in memory 604. In alternative aspects, hard-wired circuitry may be used in place of or in combination with software instructions to implement various aspects of the present disclosure. Thus, aspects of the present disclosure are not limited to any specific combination of hardware circuitry and software.

Various aspects of the subject matter described in this specification can be implemented in a computing system that includes a back end component, e.g., as a data server, or that includes a middleware component, e.g., an application server, or that includes a front end component, e.g., a client computer having a graphical user interface or a Web browser through which a user can interact with an implementation of the subject matter described in this specification, or any combination of one or more such back end, middleware, or front end components. The components of the system can be interconnected by any form or medium of digital data communication, e.g., a communication network such as network 150.

Computing system 600 includes servers and personal computer devices. A personal computing device and server are generally remote from each other and typically interact through a communication network. The relationship of client and server arises by virtue of computer programs running on the respective computers and having a client-server relationship to each other. Computer system 600 can be, for example, and without limitation, a desktop computer, laptop computer, or tablet computer. Computer system 600 can also be embedded in another device, for example, and without limitation, a mobile telephone, a personal digital assistant (PDA), a mobile audio player, a Global Positioning System (GPS) receiver, a video game console, and/or a television set top box.

The term "machine-readable storage medium" or "computer readable medium" as used herein refers to any medium or media that participates in providing instructions or data to processor 602 for execution. Such a medium may take many forms, including, but not limited to, non-volatile media, volatile media, and transmission media. Non-volatile media include, for example, optical disks, magnetic disks, or flash memory, such as data storage device 606. Volatile media include dynamic memory, such as memory 604. Transmission media include coaxial cables, copper wire, and fiber optics, including the wires that comprise bus 608. Common forms of machine-readable media include, for example, floppy disks, flexible disks, hard disks, magnetic tapes, any other magnetic medium, a CD-ROM, DVD, any other optical medium, punch cards, paper tape, any other physical medium with patterns of holes, a RAM, a PROM, an EPROM, a FLASH EPROM, any other memory chip or cartridge, or any other medium from which a computer can read. The machine-readable storage medium can be a machine-readable storage device, a machine-readable storage substrate, a memory device, a composition of matter affecting a machine-readable propagated signal, or a combination of one or more of them.

In one aspect, a method may be an operation, an instruction, or a function and vice versa. In one aspect, a clause or a claim may be amended to include some or all of the words (e.g., instructions, operations, functions, or components) recited in one or more clauses, one or more words, one or more sentences, one or more phrases, one or more paragraphs, and/or one or more claims.

Phrases such as an aspect, the aspect, another aspect, some aspects, one or more aspects, an implementation, the implementation, another implementation, some implementations, one or more implementations, an embodiment, the embodiment, another embodiment, some embodiments, one or more embodiments, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases.

A reference to an element in the singular is not intended to mean "one and only one" unless specifically stated, but rather "one or more." The term "some," refers to one or more. Underlined and/or italicized headings and subheadings are used for convenience only, do not limit the subject technology, and are not referred to in connection with the interpretation of the description of the subject technology. Relational terms such as first and second and the like may be used to distinguish one entity or action from another without necessarily requiring or implying any actual such relationship or order between such entities or actions. All structural and functional equivalents to the elements of the various configurations described throughout this disclosure that are known or later come to be known to those of ordinary skill in the art are expressly incorporated herein by reference and intended to be encompassed by the subject technology.

Moreover, nothing disclosed herein is intended to be dedicated to the public regardless of whether such disclosure is explicitly recited in the above description. No claim element is to be construed under the provisions of 35 U.S.C. § 112, sixth paragraph, unless the element is expressly recited using the phrase "means for" or, in the case of a method claim, the element is recited using the phrase "step for."

While this specification contains many specifics, these should not be construed as limitations on the scope of what may be claimed, but rather as descriptions of particular implementations of the subject matter. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

The subject matter of this specification has been described in terms of particular aspects, but other aspects can be implemented and are within the scope of the following claims. For example, while operations are depicted in the drawings in a particular order, this should not be understood as requiring that such operations be performed in the particular order shown or in sequential order, or that all illustrated operations be performed, to achieve desirable results. The actions recited in the claims can be performed in a different order and still achieve desirable results. As one example, the processes depicted in the accompanying figures do not necessarily require the particular order shown, or sequential order, to achieve desirable results. In certain circumstances, multitasking and parallel processing may be advantageous. Moreover, the separation of various system components in the aspects described above should not be understood as requiring such separation in all aspects, and it should be understood that the described program components and systems can generally be integrated together in a single software product or packaged into multiple software products.

The title, background, brief description of the drawings, abstract, and drawings are hereby incorporated into the disclosure and are provided as illustrative examples of the disclosure, not as restrictive descriptions. It is submitted with the understanding that they will not be used to limit the scope or meaning of the claims. In addition, in the detailed description, it can be seen that the description provides illustrative examples and the various features are grouped together in various implementations for the purpose of streamlining the disclosure. The method of disclosure is not to be interpreted as reflecting an intention that the claimed subject matter requires more features than are expressly recited in each claim. Rather, as the claims reflect, inventive subject matter lies in less than all features of a single disclosed configuration or operation. The claims are hereby incorporated into the detailed description, with each claim standing on its own as a separately claimed subject matter.

The claims are not intended to be limited to the aspects described herein, but are to be accorded the full scope consistent with the language claims and to encompass all legal equivalents. Notwithstanding, none of the claims are intended to embrace subject matter that fails to satisfy the requirements of the applicable patent law, nor should they be interpreted in such a way.

The invention claimed is:

1. A computer-implemented method for determining signal electromigration in an integrated circuit, comprising:
   selecting a plurality of partitions from a netlist of the integrated circuit, each of the plurality of partitions comprising independent signal paths along a plurality of components;
   determining a size of a selected partition from the plurality of partitions;
   when the size of the selected partition is greater than a pre-selected threshold, applying input vectors to at least one signal path in the selected partition to obtain a signal toggle in an output of the selected partition;
   when the size of the selected partition is smaller than the pre-selected threshold, generating a logical representation comprising a plurality of input signals;
   determining a current flow in the at least one signal path;
   identifying an electromigration result from the current flow for a first component from the plurality of components;
   generating an output database for the selected partition, the output database comprising an electromigration result for the first component; and
   combining the output database for the selected partition with a second output database from a second partition, the second output database comprising a second electromigration result for a second component in the second partition to generate an electromigration report for the netlist of the integrated circuit.

2. The computer-implemented method of claim 1, wherein identifying the electromigration result from the current flow comprises determining whether the first component from the plurality of components in the selected partition sustains the current flow.

3. The computer-implemented method of claim 1, wherein determining the size of the selected partition comprises determining a number of the plurality of components, or determining a length of the at least one signal path.

4. The computer-implemented method of claim 1, further comprising identifying the at least one signal path to be a critical path having a longest input to an output signal delay in the selected partition.

5. The computer-implemented method of claim 1, further comprising receiving at least one integrated circuit specification from a foundry and applying constraints to the at least one signal path, wherein applying the constraints to the at least one signal path comprises adjusting an input signal in the at least one signal path according to the at least one integrated circuit specification.

6. The computer-implemented method of claim 1, further comprising modifying the plurality of components when it is determined that the first component of the plurality of components cannot sustain the current flow.

7. The computer-implemented method of claim 1, further comprising identifying the second electromigration result of a separate current flow for the second component in the second partition, separately from the identifying the electromigration result of the current flow for the at least one signal path.

8. The computer-implemented method of claim 1, wherein generating the output database for the selected partition comprises providing, to a foundry, first electromigration performance of the plurality of components in the selected partition and second electromigration performance of a second plurality of components in the second partition.

9. The computer-implemented method of claim 1, further comprising identifying logically constrained signals in the selected partition to avoid an electromigration effect overestimation.

10. The computer-implemented method of claim 1, further comprising coupling a constrained input in the selected partition with a voltage supply for at least one component to satisfy a logical constraint in the at least one signal path.

11. The computer-implemented method of claim 1, further comprising:
    identifying at least two uncorrelated input constraints in the at least one signal path; and
    associating at least a single stimulus vector to the at least two uncorrelated input constraints.

12. A system, comprising:
    a memory, storing computer code; and
    at least one processor that executes the computer code to:
    select a plurality of partitions from a netlist of the integrated circuit, each of the plurality of partitions comprising independent signal paths along a plurality of components;
    determine a size of a selected partition from the plurality of partitions;
    when the size of the selected partition is greater than a pre-selected threshold, apply input vectors to at least one signal path in the selected partition to obtain a signal toggle in an output of the selected partition;
    when the size of the selected partition is smaller than the pre-selected threshold, generate a logical representation comprising a plurality of input signals;
    determine a current flow in the at least one signal path;
    identify an electromigration result from the current flow for a first component from the plurality of components;
    generate an output database for the selected partition, the output database comprising an electromigration result for the first component; and
    combine the output database for the selected partition with a second output database from a second partition, the second output database comprising a second electromigration result for a second component in the second partition to generate an electromigration report for the netlist of the integrated circuit.

13. The system of claim 12, wherein the at least one processor comprises a master processor and a slave processor coupled through a network connection, wherein the master processor is configured to provide the slave processor with an initialization routine to perform at least a portion of the computer code, and to control an execution of at least one step of multiple steps performed by the slave processor.

14. The system of claim 12, wherein the at least one processor comprises a first processor partially performing at least a first portion of the computer code in a first computational thread and a second processor partially performing at least a second portion of the computer code in a second computational thread.

15. The system of claim 12, wherein the at least one processor comprises a first processor configured to generate the output database for the selected partition in a first computational thread, and a second processor configured to generate the second output database in a second computational thread.

16. The system of claim 12, wherein the memory comprises a first application including the computer code to generate the output database for the selected partition in a first computational thread, and a second application including the computer code to generate the second output database in a second computational thread.

17. A non-transitory, machine-readable medium comprising a memory storing instructions which, when executed by a processor cause a computer to perform steps in a method, the method comprising:

determining a plurality of partitions from a netlist of the integrated circuit, a first partition of the plurality of partitions comprising an independent signal path connecting a plurality of components;

when a size of the first partition is greater than a threshold, determining a signal toggle in an output of the first partition at least by applying one or more inputs to a signal path in the first partition;

when the size of the first partition is smaller than the threshold, generating a logical representation comprising a plurality of input signals;

determining a first electromigration result for a first component in the first partition based at least in part upon a current flow in the signal path; and combining a first output data structure storing therein at least the first electromigration result for the first partition with a second output data structure from a second partition, the second output data structure comprising a second electromigration result for a second component in the second partition for the netlist of the integrated circuit.

18. The non-transitory, machine-readable medium of claim 17, wherein the instructions for determining the first electromigration result comprise additional instructions for determining whether the first component from the plurality of components in the first partition sustains the current flow.

19. The non-transitory, machine-readable medium of claim 17, wherein the instructions for determining the size of the selected partition comprises comprise additional instructions for determining a number of the plurality of components or determining a length of the at least one signal path.

20. The non-transitory, machine-readable medium of claim 17, wherein the instructions comprise additional instructions for identifying the at least one signal path to be a critical path having a longest input to an output signal delay in the selected partition.

* * * * *